(12) United States Patent
Teh et al.

(10) Patent No.: US 11,714,941 B2
(45) Date of Patent: Aug. 1, 2023

(54) MODULAR PERIPHERY TILE FOR INTEGRATED CIRCUIT DEVICE

(71) Applicant: Intel Corporation, Santa Clara, CA (US)

(72) Inventors: Chee Hak Teh, Bayan Lepas (MY); Ankireddy Nalamalpu, Portland, OR (US); Md Altaf Hossain, Portland, OR (US); Dheeraj Subbareddy, Portland, OR (US); Sean R. Atsatt, Santa Cruz, CA (US); Lai Guan Tang, Tanjung Bungah (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/392,218

(22) Filed: Aug. 2, 2021

(65) Prior Publication Data

US 2022/0198115 A1    Jun. 23, 2022

Related U.S. Application Data

(60) Continuation of application No. 16/833,122, filed on Mar. 27, 2020, now Pat. No. 11,080,449, which is a division of application No. 16/235,933, filed on Dec. 28, 2018, now Pat. No. 10,642,946.

(51) Int. Cl.
| | |
|---|---|
| G06F 30/34 | (2020.01) |
| H03K 19/17736 | (2020.01) |
| H04L 12/43 | (2006.01) |
| G06F 15/78 | (2006.01) |
| H03K 19/17796 | (2020.01) |

(52) U.S. Cl.
CPC .......... G06F 30/34 (2020.01); G06F 15/7825 (2013.01); H03K 19/17744 (2013.01); H03K 19/17796 (2013.01); H04L 12/43 (2013.01)

(58) Field of Classification Search
USPC .......................................................... 716/117
See application file for complete search history.

(56) References Cited

U.S. PATENT DOCUMENTS

| | | | | |
|---|---|---|---|---|
| 8,402,397 | B2* | 3/2013 | Robles | G06F 30/398 716/54 |
| 2004/0190274 | A1* | 9/2004 | Saito | H05K 1/141 361/783 |
| 2010/0218146 | A1 | 8/2010 | Platzker et al. | |
| 2012/0124257 | A1 | 5/2012 | Wu | |
| 2018/0196710 | A1* | 7/2018 | Iyer | G06F 11/1004 |
| 2018/0287964 | A1 | 10/2018 | Gray | |
| 2018/0307791 | A1* | 10/2018 | Mousa | G06V 10/7515 |
| 2019/0050325 | A1* | 2/2019 | Malladi | G06F 12/0862 |
| 2019/0138680 | A1* | 5/2019 | Teh | H04L 12/43 |

(Continued)

*Primary Examiner* — Mohammed Alam
(74) *Attorney, Agent, or Firm* — Fletcher Yoder, P.C.

(57) ABSTRACT

Systems or methods of the present disclosure may improve scalability (e.g., component scalability, product variation scalability) of integrated circuit systems by disaggregating periphery intellectual property (IP) circuitry into modular periphery IP tiles that can be installed as modules. Such an integrated circuit system may include a first die that includes programmable fabric circuitry and a second die that that includes a periphery IP tile. The periphery IP tile may be disaggregated from the programmable fabric die and may be communicatively coupled to the first die via a modular interface.

20 Claims, 6 Drawing Sheets

(56) References Cited

U.S. PATENT DOCUMENTS

| | | | |
|---|---|---|---|
| 2019/0220566 A1* | 7/2019 | Tang | G06F 13/20 |
| 2019/0227963 A1* | 7/2019 | Ooi | G06F 30/34 |
| 2020/0319957 A1* | 10/2020 | Iyer | H04L 1/00 |
| 2022/0198115 A1* | 6/2022 | Teh | G06F 30/34 |
| 2022/0294454 A1* | 9/2022 | Atsatt | H03K 19/1776 |

* cited by examiner

MODULAR PERIPHERY TILE FOR INTEGRATED CIRCUIT DEVICE

CROSS REFERENCE TO RELATED APPLICATIONS

This application is a continuation of and claims priority to U.S. patent application Ser. No. 16/833,122, entitled "Modular Periphery Tile for Integrated Circuit Device," filed Mar. 27, 2020, which is a divisional of and claims priority to U.S. patent application Ser. No. 16/235,933 entitled "Modular Periphery Tile for Integrated Circuit Device," filed Dec. 28, 2018, both of which are hereby incorporated by reference in their entireties for all purposes.

BACKGROUND

The present disclosure relates generally to integrated circuits, such as processors and/or field-programmable gate arrays (FPGAs). More particularly, the present disclosure relates to improving scalability (e.g., component scalability, product variation scalability) of integrated circuits using modular periphery tiles.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Modern electronics, such as computers, portable devices, network routers, data centers, Internet-connected appliances, and more, tend to include at least one integrated circuit device. Integrated circuit devices may take on a variety of forms, including processors (e.g., central processing units (CPUs)), memory devices, and programmable devices (e.g., FPGA), to name only a few examples. The programmable devices, in particular, may include a programmable fabric of logic (e.g., configurable logic blocks (CLBs)) that may be programmed (e.g., configured) and reprogrammed (e.g., reconfigured) after manufacturing to provide a wide variety of functionality based on a circuit design.

To facilitate operations, the programmable device may include a variety of periphery intellectual property cores (IPs) near and around the programmable fabric. For example, a double data rate (DDR) IP may be placed on a shoreline of the programmable fabric to avoid consuming excess routing circuitry of the programmable fabric. Due to a restricted amount of shoreline however, design compromises may occur when determining the number of and type of periphery IP to include around the shoreline. This may result in reduced device performance for certain product variations and reduced overall scalability (e.g., component scalability, product scalability) of the programmable device.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
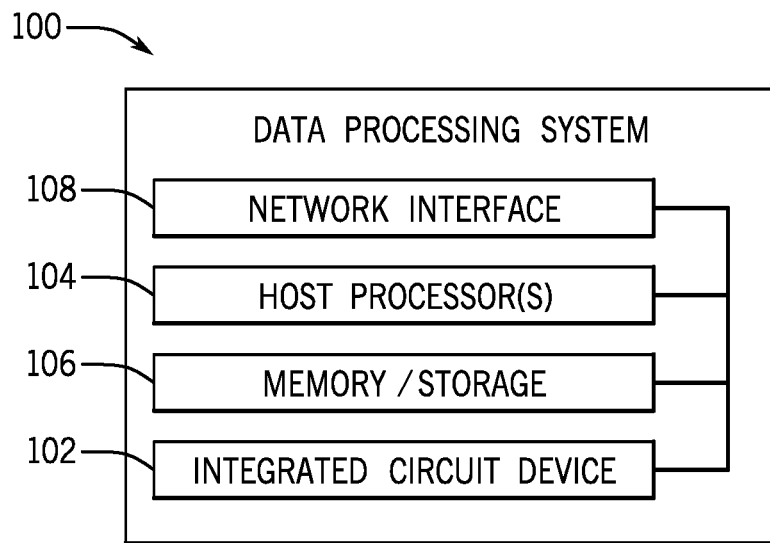
FIG. 1 is a block diagram of a data processing system including an integrated circuit device, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Integrated circuits, such as field-programmable gate arrays (FPGAs), may include a programmable fabric (e.g., programmable fabric circuitry) that may be configured and, in some cases, later reconfigured to realize a circuit design. To facilitate operations of the integrated circuit, the integrated circuit may include one or more periphery intellectual property cores (IPs) near the programmable fabric. In particular, for FPGAs, higher bandwidth periphery IP (e.g., double data rate (DDR), low power DDR (LPDDR), high bandwidth memory (HBM), embedded static random-access memory (eSRAM), universal interface bus (UIB), input/ output (I/O), and the like) may be placed around (e.g., top, bottom) the programmable fabric (e.g., at a shoreline) to improve resource (e.g., routing circuitry) allocation throughout the FPGA. Although the present disclosure will primarily use the example of a programmable device (e.g., FGPA), systems and techniques of this disclosure may be applied to any suitable integrated circuit device, such as a processor (e.g., central processing unit (CPU)), memory, and the like.

The FPGA however, may include a limited amount of shoreline around the programmable fabric, resulting in compromises in the type and amount of periphery IP that may be included in the design. As an example, a single floorplan (e.g., integrated circuit layout) may be used for multiple device variations that each have different specifications for the periphery IP and the programmable fabric. Using a single floorplan may reduce design and fabrication costs. To improve applicability of the single floorplan to the multiple product variations, the floorplan may include a design that compromises on the number of UIBs, I/Os, eSRAMs, and other periphery IP included within the floorplan. Thus, the limited amount of shoreline could result in reduced device performance for each device variation and reduced overall scalability for multiple device variations.

The FPGA may be disaggregated into smaller dies to enable customization of the periphery IP for multiple device variations and to generally improve silicon yield (e.g., number of properly performing dies fabricated onto a silicon wafer). However, because each type of periphery IP may have a unique interface with the programmable fabric die, interface customization and re-designing may occur for each device variation. Thus, having periphery IPs on the disaggregated smaller dies and with interfacing not defined by a specification (e.g., unstandardized interfacing) may increase the number of silicon die tape-ins (e.g., integration of IPs), tape-out (e.g., result of design process before design is sent for manufacturing) expenses, and positioning restrictions of the periphery IP. Thus, scalability of the FPGA components and of the variation options may be restricted.

Accordingly, and as further detailed below, embodiments of the present disclosure relate generally to improving scalability and performance of integrated circuit devices, such as FPGAs, by die-disaggregating the periphery IP. In some embodiments, the periphery IPs may be disaggregated from the main programmable fabric. In particular, the periphery IPs may be modularized into periphery IP tiles (e.g., I/O tiles, UIB tiles, eSRAM tiles, and the like) that may be independently designed and fabricated from the design and fabrication of the programmable fabric die. As such, the cost and time consumed during tape-in and tape-out for the variation designs may be reduced. Additionally, because the periphery IP are no longer on the main programmable fabric die, FPGA connectivity may not be negatively impacted by the periphery IP.

Additionally or alternatively, in some embodiments, inter-programmable fabric die communication and communication between the programmable fabric die and the periphery IP tiles may occur, for example, via a silicon interposer (e.g., electrical signal conduits) and stitched (e.g., joined) direct communication (e.g., Advanced Interface Bus (AIB), direct interface column). Because of the direct communication link between the programmable fabric dies and the periphery IP tiles, the programmable device may appear and be programmed as a monolithic integrated circuit (e.g., as if the multiple dies were a single monolithic chip). Further, the modular interfacing, for example, via the silicon interposer (e.g., silicon interface) and the stitched direct communication, may reduce cost/time of the design process and may improve scalability of the programmable device as new periphery IP may be included in the programmable device design without significant design overhead.

With the foregoing in mind, FIG. 1 is a block diagram of a data processing system 100 including an integrated circuit device 102, in accordance with an embodiment of the present disclosure. The data processing system 100 may include more or fewer components (e.g., electronic display, user interface structures, application specific integrated circuits (ASICs)) than shown. The data processing system 100 may include one or more host processors 104, such as an INTEL® Xeon® processor or a reduced-instruction processor (e.g., a reduced instruction set computer (RISC), an Advanced RISC Machine (ARM) processor) that may manage a data processing request for the data processing system 100 (e.g., to perform machine learning, video processing, voice recognition, image recognition, data compression, database search ranking, bioinformatics, network security pattern identification, spatial navigation, or the like).

The host processor(s) 104 may communicate with the memory and/or storage circuitry 106, which may be a tangible, non-transitory, machine-readable-medium, such as random-access memory (RAM), read-only memory (ROM), one or more hard drives, flash memory, or any other suitable optical, magnetic or solid-state storage medium. The memory and/or storage circuitry 106 may hold data to be processed by the data processing system 100, such as processor-executable control software, configuration software, system parameters, configuration data, etc. The data processing system 100 may also include a network interface 108 that allows the data processing system 100 to communicate with other electronic devices. In some embodiments, the data processing system 100 may be part of a data center that processes a variety of different requests. For instance, the data processing system 100 may receive a data processing request via the network interface 108 to perform machine learning, video processing, voice recognition, image recognition, data compression, database search ranking, bioinformatics, network security pattern identification, spatial navigation, or some other specialized task. The data processing system 100 may further include the integrated circuit device 102 that performs implementation of data processing requests.

Figure 2:
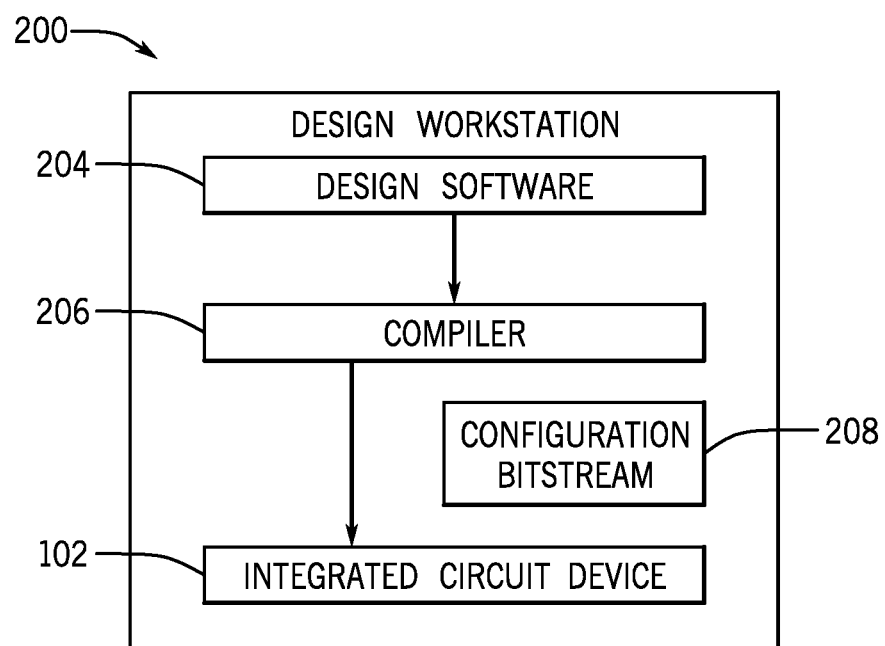
FIG. 2 is a block diagram of a design workstation that may facilitate programming of the integrated circuit device of FIG. 1, in accordance with an embodiment of the present disclosure.

A designer may use a design workstation 200 to develop a design that may configure the integrated circuit device 102, as shown in FIG. 2, in accordance with an embodiment of the present disclosure. In some embodiments, the designer may use design software 204 (e.g., Intel® Quartus® by INTEL CORPORATION) to generate a design that may be used to program (e.g., configure) the integrated circuit device 102. For example, a designer may program the modularized integrated circuit device 102 to implement a specific functionality, such as implementing a circuit design (e.g., higher-level circuit design), as if the integrated circuit device 102 were monolithic. The integrated circuit device 102 may be a programmable integrated circuit, such as a field-programmable gate array (FPGA) that includes the programmable fabric die(s) and periphery IP tile die(s).

As such, the design software 204 may use a compiler 206 to generate a lower-level circuit-design configuration for the integrated circuit device 102. That is, the compiler 206 may provide machine-readable instructions representative of the designer-specified functionality to the integrated circuit device 102, for example, in the form of a configuration bitstream 208. The host processor(s) 104 may coordinate the loading of the bitstream 208 onto the integrated circuit device 102 and subsequent programming of the programmable fabric.

Figure 3:
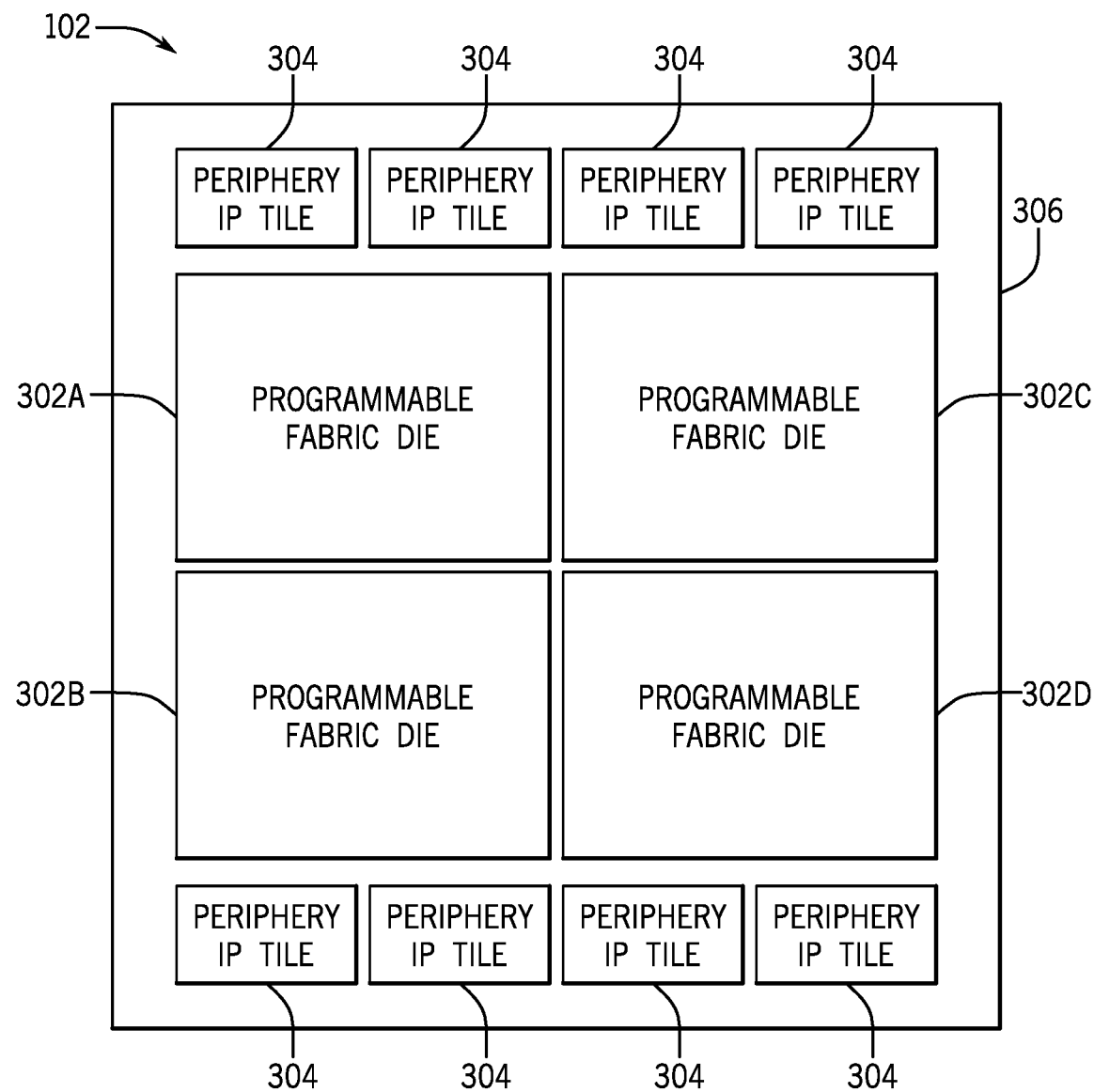
FIG. 3 is a schematic of an integrated circuit device including periphery intellectual property cores (IPs) that have been disaggregated from a programmable fabric of the integrated circuit device, in accordance with an embodiment of the present disclosure.

To improve scalability of the integrated circuit (e.g., FPGA), the periphery IP may be modularized into periphery IP tile, such that design and fabrication of the periphery IP tile may occur independently of the design and fabrication of the programmable fabric die and in a manner that enables modular interfacing (e.g., as defined by a specification to achieve a substantially uniform manner of interfacing for different tiles, which may be standardized) between the periphery IP tile and the programmable fabric die. FIG. 3 illustrates an example of the integrated circuit device 102 constructed with disaggregated periphery IP tiles and programmable fabric dies, in accordance with an embodiment of the present disclosure. Although the integrated circuit device 102 is shown as an FPGA, it should be appreciated that the periphery IP tiles may be disaggregated for any suitable type of integrated circuit device 102.

As shown, one or more programmable fabric dies 302A, 302B, 302C, 302D (collectively, 302) may be included in the integrated circuit device 102 to facilitate programming of the FPGA. In particular, the programmable fabric dies 302 may include programmable logic, such as sectors of programmable logic. The programmable logic may be arranged in groups that are sometimes referred to as configurable logic blocks (CLBs) or Logic Array Blocks (LABs). The programmable logic may receive the configuration bitstream 208 from the host processor(s) 104 and may be configured in accordance with the circuit design embodied by the configuration bitstream 208. The programmable fabric dies 302 may be configured or partially configured at run-time and/or may be re-configured or partially re-configured at a later time, enabling design flexibility post-manufacturing.

Further, as shown, periphery IP tiles 304 may be placed near the programmable fabric dies 302. The periphery IP tiles 304 may be periphery IPs, such as I/O IP, UIB IP, memory IPs, and the like. The periphery IP tiles 304 may be designed and/or fabricated independently of the programmable fabric dies 302 since the periphery IP tiles 304 are not on the same die as the programmable fabric dies 302. Thus, the periphery IPs may no longer limit buildable die size or reduce programming flexibility of the FPGA.

Communication on the integrated circuit device 102 may occur via a silicon interposer 306 or via an embedded interface bridge, which is a signal conducting channel through the silicon base material. In particular, intra-fabric communication within the programmable fabric die (e.g., 302A) may remain intact despite modularization of the periphery IP. Further, inter-programmable fabric die communication (e.g., fabric-to-fabric communication) may occur through interfaces within the silicon interposer 306 as may communication between the programmable fabric dies 302 and the periphery IP tile 304. Because the communication interface (e.g., modular interface) is defined by a specification and direct between the programmable fabric dies 302 and the periphery IP tile 304, the integrated circuit device 102 may be customized for different product variations and may be programmed by the design workstation 200 as if the integrated circuit device 102 were monolithic.

Figure 4:
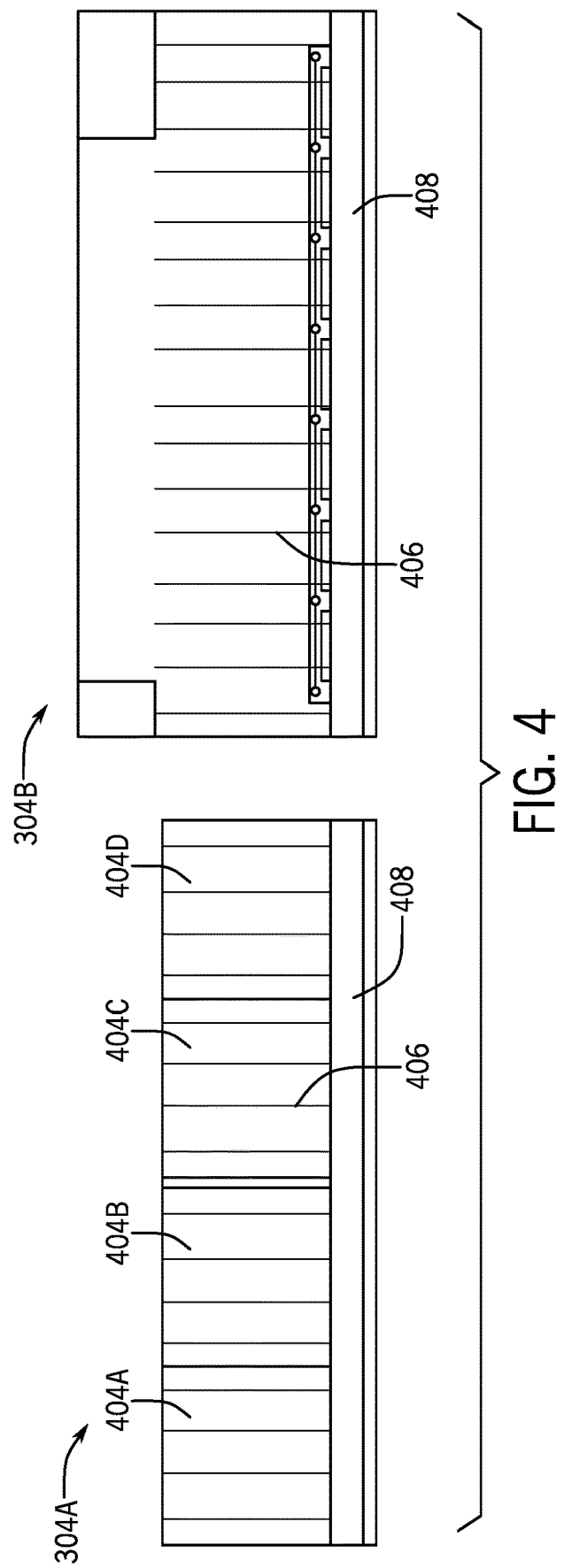
FIG. 4 is a schematic of periphery IP architecture once the periphery IPs have been modularized into periphery IP tiles, in accordance with an embodiment of the present disclosure.

FIG. 4 illustrates an example of periphery IP tiles 304 that may be designed and fabricated independent of the programmable fabric dies 302. In some embodiments, the periphery IP tiles 304 may be an I/O tile 304A and/or a UIB tile 304B. Briefly, the I/O tile 304A and UIB tile 304B may be used to facilitate communication between the programmable fabric dies 302 and external devices. The I/O tile 304A and UIB tile 304B may be separated into separate tiles due to design bandwidth and capacity constraints. As an example, certain device applications may use higher memory bandwidth while compromising on memory capacity or vice versa. Certain memory IP, such as high bandwidth memory (HBM) IP or external ASIC, may support high memory bandwidth while compromising on memory capacity and thus, may be muxed to the UIB tile 304B. Other memory IP, such as double data rate (DDR) IP, may support higher memory capacity while compromising on memory bandwidth and thus, may be muxed to the I/O tile 304A. By separating the device interface into the I/O tile 304A and the UIB tile 304B, connections between the programmable fabric dies 302 and external devices may be tailored (e.g., via muxing) depending on the target product variation. As such, the periphery IP tiles 304 may enable customization of product variations and future product scalability.

The I/O tile 304A may include any suitable number of IO blocks and/or physical IO connection lanes. In the example of FIG. 4, there are four IO96 blocks 404A, 404B, 404C, 404D (collectively, 404) that each supports 96 IO connection lanes, but more or fewer may be supported by different blocks. Each IO96 block 404 may be a baseline configurable I/O block that can be programmed to form a general-purpose input output (GPIO) port and/or programmed to interface with external devices, such as external memory (e.g., DDR). Each IO96 block 404 may include 4 microbumps that provide die-to-die connection, and, as will be discussed in further detail below, each microbump may be associated with an Advanced Interface Bus-Direct (AIB-D) interface 406 used to directly connect the programmable fabric dies 302 and the periphery IP tiles 304 over DDR. Briefly, the AIB-D interface 406 may be IP columns within the silicon interposer 306 that houses bidirectional I/O buffers and may provide wire-to-wire connection as well as any suitable form of time division multiplexing (TDM) support (e.g., 2:1 TDM, 3:1 TDM, 4:1 TDM, 5:1 TDM, 6:1 TDM, 7:1 TDM, 8:1 TDM, or higher). It should further be appreciated that the TDM support may be of any variety.

Further, the I/O tile 304A may include an interface for a fabric network-on-chip (FNOC) 408 within the silicon interposer 306 that may bridge the I/O tile 304A to the programmable fabric dies 302 using a high-speed (e.g., high-bandwidth of 0.25-0.5 terabytes per second per direction per link) NOC interface. Similarly, the UIB tile 304B may include the AIB-D interface 406 and the interface for the FNOC 408 to facilitate connectivity between the UIB tile 304B and the programmable fabric dies 302. Although the I/O tile 304A and the UIB tile 304B are not part of the programmable fabric die 302, the tiles 304A, 304B may include the FNOC to facilitate communication. Further, it should be understood that the periphery IP tiles 304 have been described using the I/O tile 304A and UIB tile 304B, the periphery IP tiles 304 may be any IP tile, such as a DDR IP tile.

Figure 5:
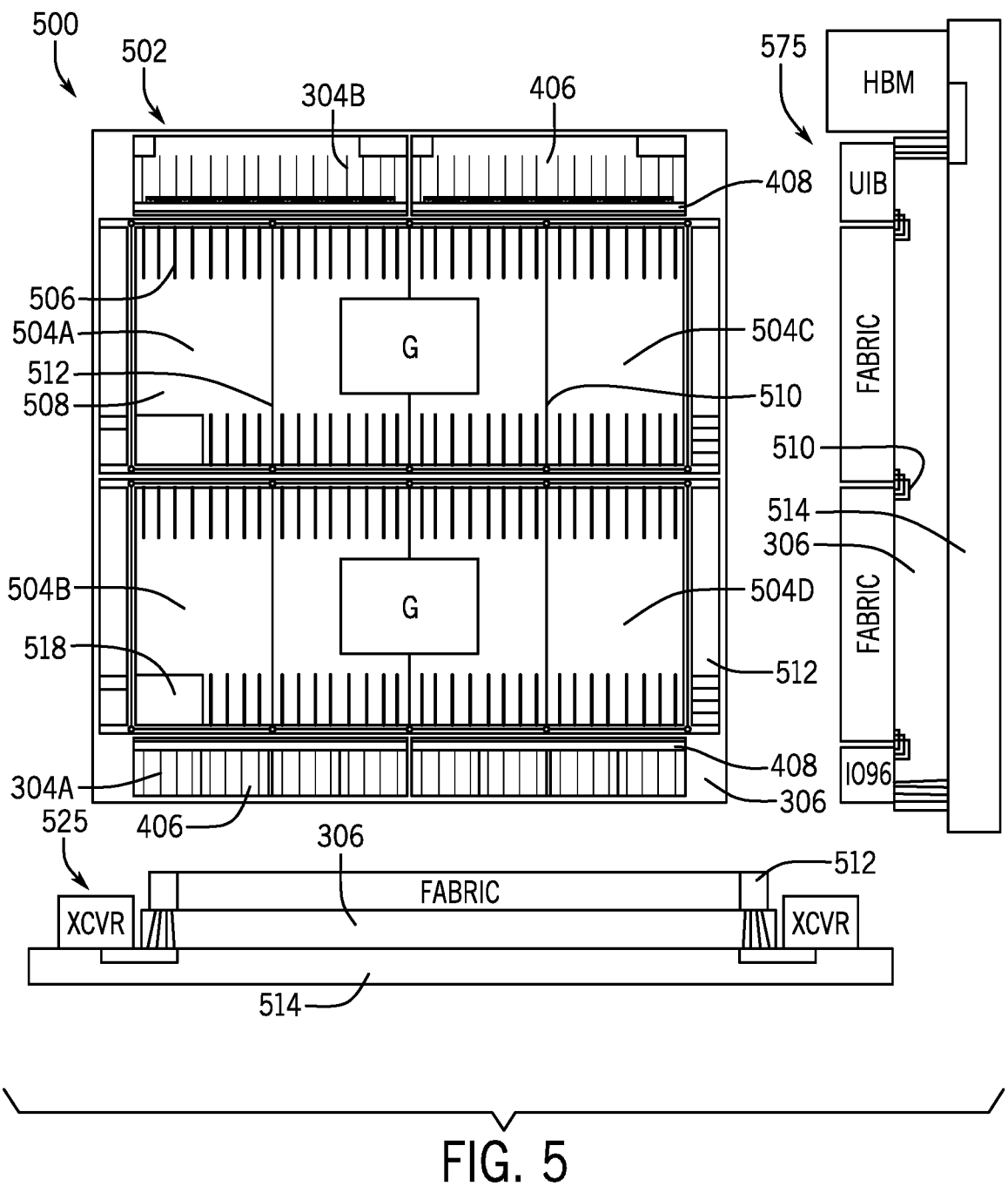
FIG. 5 is a schematic of an integrated circuit device that includes architecture of the disaggregated periphery IPs and of the programmable fabric of the integrated circuit device, in accordance with an embodiment of the present disclosure.

The disaggregated FPGA device 500 of FIG. 5 further illustrates the connectivity and placement architecture for the modularized periphery IP tiles 304 and the programmable fabric dies 302, in accordance with an embodiment of the present disclosure. It should be appreciated that while the FPGA device 500 is shown with a certain number of programmable fabric dies 302, connections, and periphery IP tile 304 type, the present disclosure contemplates suitable variations of the FPGA device 500.

The FPGA device 500 is shown as a top view 502 and side views 525, 575. The FPGA device 500 may include the periphery IP tiles 304, such as the I/O tile 304A and the UIB tile 304B. As previously described, the periphery IP tiles 304 may include the AIB-D interface 406 and the FNOC 408. The number of AIB-Ds 406 included within the periphery IP tile 304 may be based on the number of microbumps available and may be defined by a specification that modularizes the interface between the periphery IP tile 304 and the programmable fabric dies (e.g., glue dies) 504A, 504B, 504C, 504D (collectively, 504) included in the FPGA device 500. For example, the I/O tile 304A may include 4 IO96 blocks, each with 4 AIB-Ds 406 since a glue die 504 may be 4 sectors 508 wide and each sector 508 may include 4 AIB-Ds 506. As another example, the glue die 504 may be 4 sectors 508 wide and each sector 508 may include 4 AIB-Ds 506 to match the UIB and HBM interfaces. The glue dies 504 may include a security modules (e.g., secure device managers (SDMs)) to authenticate configuration data for each glue die 504.

Further, the AIB-D interface 406 in the silicon interposer 306 may provide direct connection between the glue die 504A and the periphery IP tile 304, such that the FPGA device 500 may be programmed as if the FPGA device 500 were monolithic. Additionally, the 2:1 TDM capability of the AIB-D interface 406 may increase the number of direct connections. In particular, for lower frequency interfaces, such as between the glue die 504A and the periphery IP tile 304, the 2:1 TDM may provide 2 connections per microbump due to the bidirectional buffer of the AIB-D interface 406. Thus, restrictions on the number of connections possible due to limited microbumps may be overcome and further reach (e.g., connection) is possible without having to push the AIB-D interface 406 columns deeper into the glue die 504. On the other hand, fabric-to-fabric communication may bypass the 2:1 TDM functionality and may instead use wire-to-wire communication.

Furthermore, the AIB-D interface 406 may increase the shoreline reach, such that periphery IP tiles 304 may communicate with the glue die 504 without consuming excess amounts of routing circuitry. As an example, each sector 508 may have 4 AIB-D interface 406 columns. The 4 AIB-D interface 406 columns may increase the shoreline reach 4 times than that which was available when only horizontal connections of the glue die 504 were available for interfacing.

Additionally, components of the FPGA device 500 may communicate via the NOC, such as an FNOC 408 or source of configuration network-on-chip (CNOC). As previously described, the periphery IP tiles 304 may include an FNOC 408 that is used for high-speed communication with the NOCs 510 of the glue die 504. In particular, Advanced Interference Bus-Edge (AIB-E) (e.g., edge interface) may facilitate high-speed DDR interfacing over the FNOC 408, 510. For example, the AIB-E may bridge together the NOCs 510 of the glue die 504, the NOC 510 within the glue die (e.g., 504A), and/or the NOC 510 of the glue die 504 to the FNOC 408 of the periphery IP tiles 304. Further, the AIB-E may transmit packetized data from router 512 to router 512 until the packetized data reaches its destination.

The FPGA device 500 may also include Advanced Interface Bus-Generic (AIB-G) (e.g., generic interface) interface that is used to bridge dies with low connection bandwidth, such as to transceiver blocks. Additionally, as shown by side views 525, 572, the glue die 504 and the periphery IP tiles 304 may rest on the silicon interposer (e.g., passive interposer) 306. The silicon interposer 306 may in turn be support by the package substrate 514, which supports electrical connections of the FPGA device 500. While the silicon interposer 306 is described as a passive interposer in many of the examples, the silicon interposer 306 may also contain active components and may be an active interposer in some embodiments.

Figure 6:
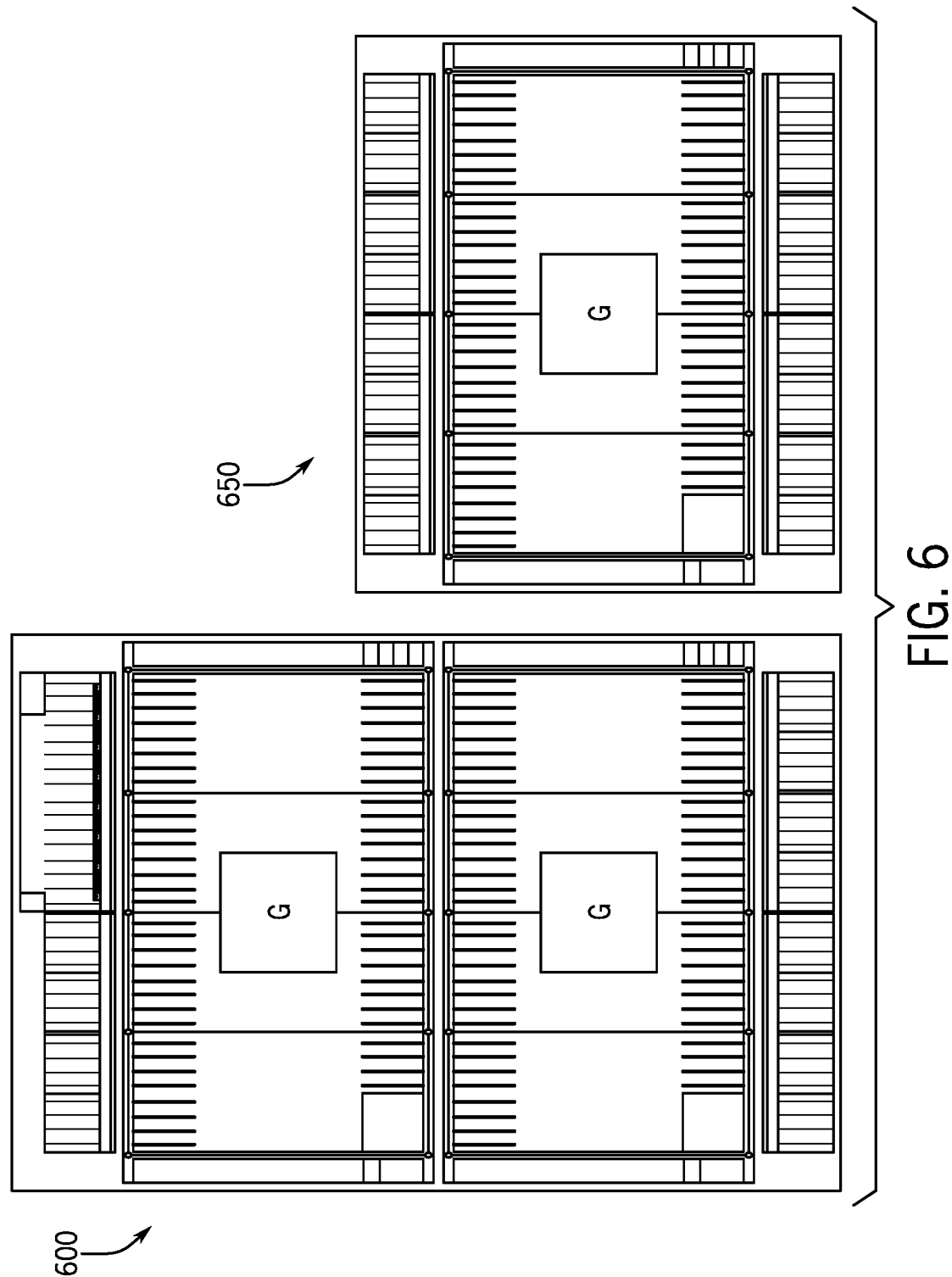
FIG. 6 is another schematic of an integrated circuit device that includes the architecture of the disaggregated periphery IPs and of the programmable fabric of the integrated circuit device, in accordance with an embodiment of the present disclosure.

FIG. 6 illustrates additional examples of FPGA device 600, 650 that are composed of disaggregated periphery IP tiles 304 and glue dies 504, in accordance with an embodiment of the present disclosure. Because the interface between the periphery IP tiles 304 and the glue dies 504 is defined by a specification and because the periphery IP tiles 304 are modularized, various combinations of periphery IP tiles 304 may be included within an FPGA die. For example, the FPGA device 600 may include a single UIB tile 304B and multiple I/O tiles 304A. As another example, the FPGA device 650 may include only I/O tiles. In some embodiments, the periphery IP tile 304 at the bottom of the FPGA device 600, 650 may be rotated versions of the periphery IP tile 304 at the top of the FPGA device 600, 650.

Figure 7:
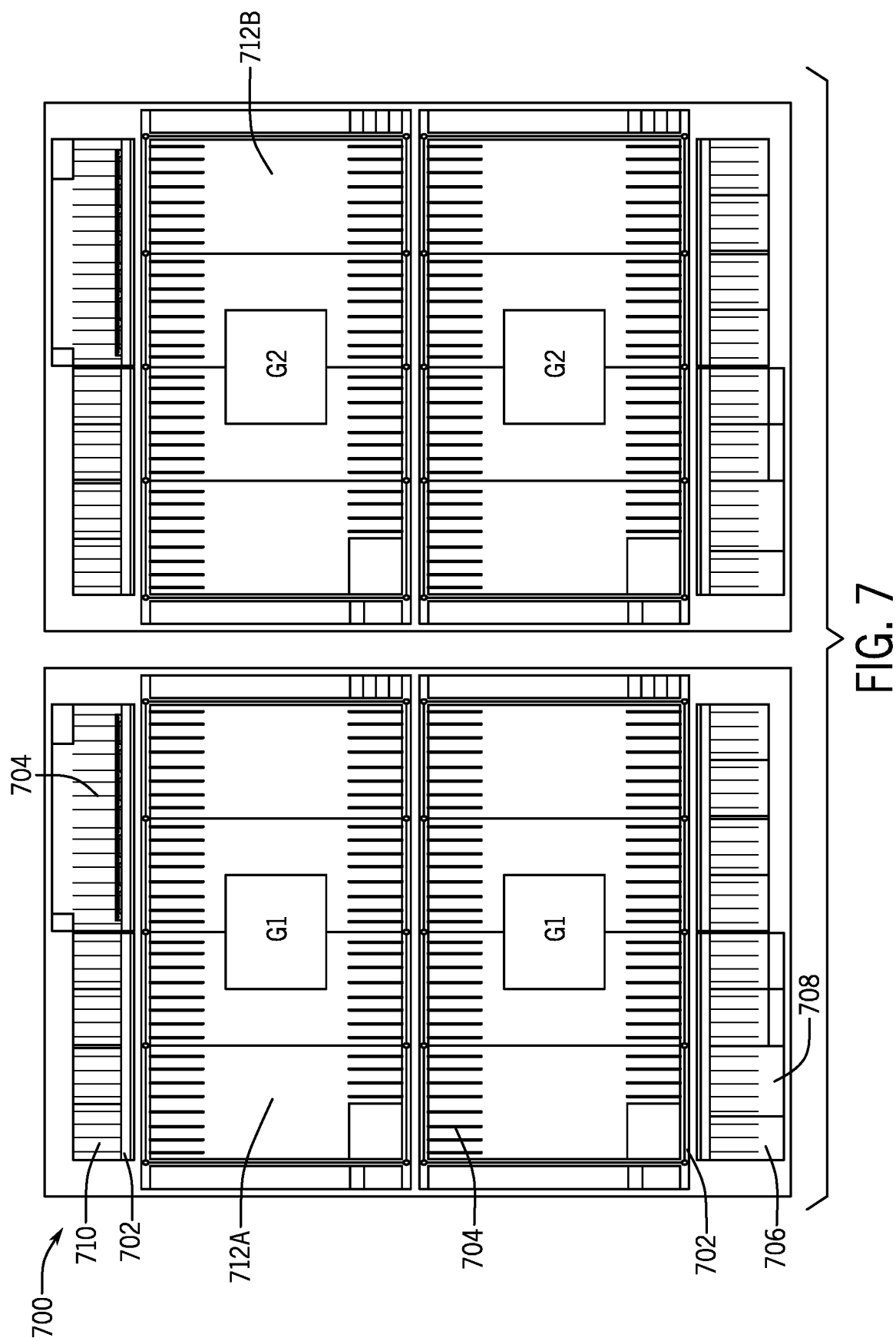
FIG. 7 is another schematic of integrated circuit devices that includes the architecture of the disaggregated periphery IPs and of the programmable fabric of the integrated circuit device, in accordance with an embodiment of the present disclosure.

FIG. 7 illustrates additional examples of disaggregated FPGA devices 700 that are composed of disaggregated periphery IP tiles 304 and glue dies 712A, 712B (collectively, 712), in accordance with an embodiment of the present disclosure. In particular, the periphery IP tiles 304 and the glue dies 712 may include an AIB-E interface 702 used to bridge the NOCs and/or FNOCs of the periphery IP tiles 304 and the glue die 712 and/or the glue dies 712 with one another. The periphery IP tiles 304 and the glue dies 712 may include an AIB-D interface 704, which may provide a direct interface between the periphery IP tiles 304 and the glue dies 712 without interfacing via a network-on-chip. In some embodiments, the AIB-D interface 704 of the periphery IP tiles 304 may include wider columns to facilitate direct communication. Further, the AIB-D interface 704 of the glue dies 712 may include 5 AIB-D interface 704 columns. It should be appreciated that any number of AIB-D interface 704 columns and of any width may be included in the periphery IP tiles 304 and/or the glue dies 712.

In some embodiments, the SDM 706 may be disaggregated from the glue dies 712 and instead, may be included in the periphery IP tiles 304. This may further remove blockages from the FPGA routing circuitry within the programmable fabric. Because the SDM 706 has been included within the periphery IP tile 304 instead of the glue dies 712, a Die Sub-System Manager (DSSM) may be included in the glue dies 712 to act as a proxy for the SDM. In addition, the hard processor system (HPS) 708 may be included within the periphery IP tiles 304. As shown, the glue dies 712 may include different instances of the core fabric. For example, the glue dies (e.g., glue die 1) 712A may include a higher amount of digital signal processing (DSP) blocks than other glue dies 712. As another example, the glue dies (e.g., glue die 2) 712B may include more memory blocks than the other glue dies 712.

The present systems and techniques relate to embodiments for improving scalability of integrated circuit devices 102 by modularizing periphery IPs. The present embodiments may enable customization of the integrated circuit device 102 for different variation options using a single tape in a scalable approach. Further, the present embodiments may reduce die size and improve silicon yield. Furthermore, the embodiments enable the design software to view and program the disaggregated peripheries and programmable fabric as if the integrated circuit device 102 were monolithic. Additionally, parallel connectivity may be improved due to reduced package traces for routing connections and due to reduced blockages within the routing of the programmable fabric by the periphery IP.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A multi-die package, comprising:
   a package substrate;
   a plurality of first dies mounted on the package substrate and comprising a first plurality of routers to facilitate off-package communication, wherein respective dies of the plurality of first dies perform processing; and
   an input/output (I/O) die physically separate from the plurality of first dies, wherein the I/O die is mounted on the package substrate and configurable to support external memory interfaces comprising a second plurality of routers to facilitate off-package communication with the plurality of first dies by interfacing with the first plurality of routers, wherein the I/O die facilitates off-package communication between the plurality of first dies and one or more off-package devices via the package substrate.

2. The multi-die package of claim 1, wherein the I/O die is configurable to support double data rate (DDR) external memory interface.

3. The multi-die package of claim 2, wherein the plurality of first dies and the I/O die are communicatively coupled via the package substrate via one or more channels formed in the package substrate.

4. The multi-die package of claim 2, comprising a packet transfer system spanning the plurality of first dies and the I/O die, wherein the packet transfer system comprises the first plurality of routers and the second plurality of routers to route data packets between the plurality of first dies and the I/O die.

5. The multi-die package of claim 1, wherein respective dies of the plurality of first dies have a first size and the I/O die has a second size that is different than the first size.

6. The multi-die package of claim 1, wherein:
   the plurality of first dies are fabricated using a first process technology;
   the I/O die is fabricated using a second process technology; and
   the first process technology is different than the second process technology.

7. The multi-die package of claim 1, wherein a die of the plurality of first dies comprises a security module to authenticate data for the die of the plurality of first dies.

8. The multi-die package of claim 1, wherein respective dies of the plurality of first dies comprise a respective router of the first plurality of routers.

9. The multi-die package of claim 8, wherein the respective router facilitates communication of packetized data to a destination processor.

10. The multi-die package of claim 1, wherein the one or more off-package devices comprise Random-Access Memory (RAM), Read-Only Memory (ROM), flash memory, one or more hard drives, a network interface, one or more host processors, or any combination thereof.

11. An integrated circuit package, comprising:
    a plurality of first dies mounted on a package substrate, the plurality of first dies comprising first packet transfer circuitry to facilitate communication, wherein respective dies of the plurality of first dies performs processing; and
    an input/output (I/O) die to support external memory interfaces, wherein the I/O die is physically separate from the plurality of first dies, mounted on the package substrate, and comprises second packet transfer circuitry to facilitate communication with the plurality of first dies by interfacing with the first packet transfer circuitry, wherein the I/O die facilitates off-package communication between the plurality of first dies and one or more off-package devices via the package substrate, wherein respective dies of the plurality of first dies have a first size and the I/O die has a second size that is different than the first size.

12. The integrated circuit package of claim 11, wherein the I/O die is configurable to support double data rate (DDR) external memory interfaces.

13. The integrated circuit package of claim 11, wherein a die of the plurality of first dies comprises a security module to authenticate data for the die of the plurality of first dies.

14. The integrated circuit package of claim 11, wherein the one or more off-package devices comprise Random-Access Memory (RAM), Read-Only Memory (ROM), flash memory, one or more hard drives, a network interface, one or more host processors, or any combination thereof.

15. A system, comprising:
    one or more off-package devices; and
    a multi-die package, comprising:
       a package substrate;
       a plurality of first dies mounted on the package substrate, wherein a respective die of the plurality of first dies performs processing, wherein the plurality of first dies comprises a first plurality of routers to facilitate communication; and
       an input/output (I/O) die physically separate from the plurality of first dies, mounted on the package substrate, and configurable to support external memory interfaces, wherein the I/O die:
          facilitates off-package communication between the plurality of first dies and the one or more off-package devices via the package substrate; and
          comprises a second plurality of routers to facilitate communication with the plurality of first dies by interfacing with the first plurality of routers.

16. The system of claim 15, wherein the one or more off-package devices comprise Random-Access Memory (RAM), Read-Only Memory (ROM), flash memory, one or more hard drives, a network interface, one or more host processors, or any combination thereof.

17. The system of claim 15, wherein a die of the plurality of first dies comprises a security module to authenticate data for the die of the plurality of first dies.

18. The system of claim 15, comprising a network interface configurable to communicate with one or more devices external to the multi-die package.

19. The system of claim 15, wherein:
the plurality of first dies and the I/O die are communicatively coupled via the package substrate via one or more channels formed in the package substrate; and
respective dies of the plurality of first dies have a first size and the I/O die has a second size that is different that the first size.

20. The system of claim 15, wherein:
the plurality of first dies are fabricated using a first process technology;
the I/O die is fabricated using a second process technology; and
the first process technology is different than the second process technology.

\* \* \* \* \*